(12) United States Patent
Hara et al.

(10) Patent No.: US 12,720,878 B2
(45) Date of Patent: Aug. 25, 2026

(54) IMAGING ELEMENT PACKAGE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventors: Yuji Hara, Kumamoto (JP); Kosuke Hareyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 483 days.

(21) Appl. No.: 18/253,637

(22) PCT Filed: Nov. 16, 2021

(86) PCT No.: PCT/JP2021/042006

§ 371 (c)(1),
(2) Date: May 19, 2023

(87) PCT Pub. No.: WO2022/113813

PCT Pub. Date: Jun. 2, 2022

(65) Prior Publication Data

US 2023/0420404 A1 Dec. 28, 2023

(30) Foreign Application Priority Data

Nov. 30, 2020 (JP) ................................ 2020-198486

(51) Int. Cl.
*H10F 39/00* (2025.01)
*H10W 72/00* (2026.01)
(Continued)

(52) U.S. Cl.
CPC ......... *H10F 39/011* (2025.01); *H10F 39/804* (2025.01); *H10F 39/811* (2025.01);
(Continued)

(58) Field of Classification Search
CPC .... H10F 39/011; H10F 39/804; H10F 39/811; H01L 24/48; H01L 24/29; H01L 24/32;
(Continued)

(56) References Cited

U.S. PATENT DOCUMENTS 4,845,543 A * 7/1989 Okikawa ................ H01L 24/45 257/784
2006/0032894 A1 * 2/2006 Wong ..................... H01L 24/48 228/180.5
(Continued)

FOREIGN PATENT DOCUMENTS

JP H11-150144 6/1999
JP 2001-156107 6/2001
(Continued)

OTHER PUBLICATIONS

English translation of JP 2010109137 (Year: 2010).*
(Continued)

*Primary Examiner* — Igwe U Anya
(74) *Attorney, Agent, or Firm* — SHERIDAN ROSS P.C.

(57) ABSTRACT

The present disclosure relates to an imaging element package, a method of manufacturing the same, and an electronic device capable of further improving reliability. An imaging element package includes a solid-state imaging element having a first pad, a substrate on which the solid-state imaging element is mounted, the substrate having a second pad, and a wire wiring that connects the first pad and the second pad. The wire wiring has a ball portion bonded to the first pad in a shape having a thickness equal to or larger than a depth of an opening portion provided for opening the first pad, and a crescent portion provided by pressing an end of the metal wire against the ball portion and bonding the end
(Continued)

to the ball portion, and connected to the metal wire with a connection length of a predetermined ratio or more with respect to the metal wire.

20 Claims, 17 Drawing Sheets

(51) Int. Cl.

| | |
|---|---|
| ***H10W 72/30*** | (2026.01) |
| ***H10W 72/50*** | (2026.01) |
| ***H10W 90/00*** | (2026.01) |

(52) U.S. Cl.
CPC .... *H10W 72/073* (2026.01); *H10W 72/07338* (2026.01); *H10W 72/07354* (2026.01); *H10W 72/075* (2026.01); *H10W 72/07511* (2026.01); *H10W 72/07521* (2026.01); *H10W 72/07552* (2026.01); *H10W 72/07554* (2026.01); *H10W 72/344* (2026.01); *H10W 72/347* (2026.01); *H10W 72/521* (2026.01); *H10W 72/536* (2026.01); *H10W 72/5363* (2026.01); *H10W 72/5434* (2026.01); *H10W 72/5522* (2026.01); *H10W 72/865* (2026.01); *H10W 72/884* (2026.01); *H10W 90/734* (2026.01); *H10W 90/754* (2026.01)

(58) Field of Classification Search
CPC H01L 24/45; H01L 24/85; H01L 2924/20752
USPC .......................................................... 257/459
See application file for complete search history.

(56) References Cited

U.S. PATENT DOCUMENTS

| | | | | |
|---|---|---|---|---|
| 2008/0272487 | A1* | 11/2008 | Shim ................... | H10W 72/075<br>257/737 |
| 2009/0098687 | A1* | 4/2009 | Antol ...................... | H01L 24/78<br>257/E21.519 |
| 2009/0166784 | A1* | 7/2009 | Honda .................... | H01L 24/97<br>257/432 |
| 2014/0054739 | A1 | 2/2014 | Kameshima | |
| 2015/0145148 | A1* | 5/2015 | Tran ........................ | H01L 24/48<br>228/110.1 |
| 2015/0200181 | A1* | 7/2015 | Haga ...................... | B23K 20/10<br>438/127 |
| 2021/0343771 | A1* | 11/2021 | Iida ....................... | H10F 39/811 |

FOREIGN PATENT DOCUMENTS

| | | | | |
|---|---|---|---|---|
| JP | 2004-179303 | | 6/2004 | |
| JP | 2010109137 A | * | 5/2010 | .......... H10W 20/218 |
| JP | 2014-044989 | | 3/2014 | |
| KR | 20080040246 A | | 5/2008 | |
| KR | 20170078627 A | | 7/2017 | |
| KR | 20200036660 A | | 4/2020 | |
| WO | WO-2020085116 A1 | * | 4/2020 | ............ H10F 39/811 |

OTHER PUBLICATIONS

International Search Report and Written Opinion prepared by the Japan Patent Office on Feb. 9, 2022, for International Application No. PCT/JP2021/042006, 2 pgs.

* cited by examiner

FIG. 5

| | | CONVENTIONAL TECHNOLOGY 1 | | CONVENTIONAL TECHNOLOGY 2 | | PRESENT TECHNOLOGY | |
|---|---|---|---|---|---|---|---|
| SHAPE | BALL THICKNESS/BALL DIAMETER | THIN | THIN FOR BEING PRESSED AND CRUSHED | THICK | ABOUT 15μm/ ABOUT 64.5μm | THICK | ABOUT 14μm/ ABOUT 66μm |
| | CRESCENT THICKNESS/BALL DIAMETER | THIN | BALL THICKNESS ≈CRESCENT THICKNESS | THICK | ABOUT 20μm/ ABOUT 64.5μm | THIN | ABOUT 10μm/ ABOUT 66μm |
| | CRESCENT WIDTH/BALL DIAMETER | WIDE | BALL THICKNESS ≈CRESCENT THICKNESS | NARROW | ABOUT 35μm/ ABOUT 64.5μm | WIDE | ABOUT 40μm/ ABOUT 66μm |
| | CONNECTION LENGTH/BALL DIAMETER | LONG | BALL THICKNESS ≈CRESCENT THICKNESS | SHORT | ABOUT 1/2 | LONG | ABOUT 2/3 OR MORE |
| PROBLEM | REDUCED HEIGHT) DOES THICKNESS OF SG RESIN FALL WITHIN ABOUT 150μm? | ○ | BALL THICKNESS AND WIRE HEIGHT ARE EQUAL | ○ | THICKNESS OF SG RESIN FALLS WITHIN ABOUT 150μm | ○ | THICKNESS OF SG RESIN FALLS WITHIN ABOUT 150μm |
| | DEEP Pad) DOES DEPTH OF Pad OF ABOUT 8μm OR MORE CAUSE INTERFERENCE? | × | THERE IS RISK OF INTERFERENCE WITH SIDE WALL OF OPENING OF Pad | ○ | NO INTERFERENCE OCCURS FOR THICK BALL | ○ | NO INTERFERENCE OCCURS |
| | DAMAGE BELOW Pad) DOES DAMAGE OCCUR AFTER BONDING? | × | THERE IS RISK OF DAMAGE DUE TO HIGH LOAD | ○ | NO DAMAGE OCCURS FOR LOW LOAD | ○ | NO DAMAGE OCCURS |
| | THICK Chip) DOES THICKNESS OF Chip OF 400μm OR MORE CAUSE WIRE DISCONNECTION BY REFLOW AT 260°C? | △ | THERE IS RISK OF DISCONNECTION DUE TO THIN NECK | × | WIRE DISCONNECTION OCCURS AT TIME OF Reflow | ○ | NO TROUBLE OCCURS |

FIG. 6
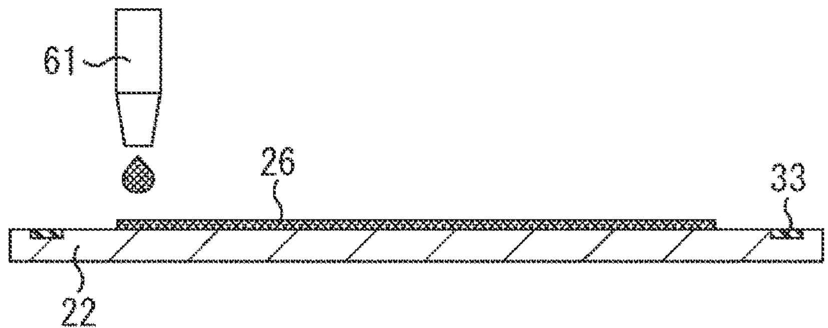
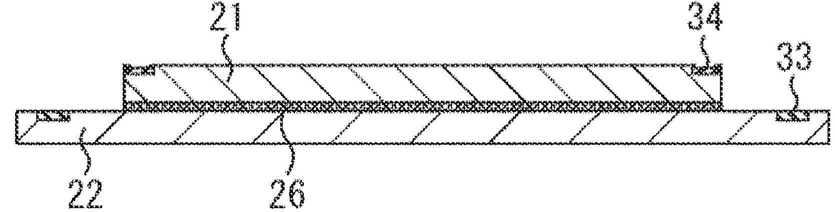
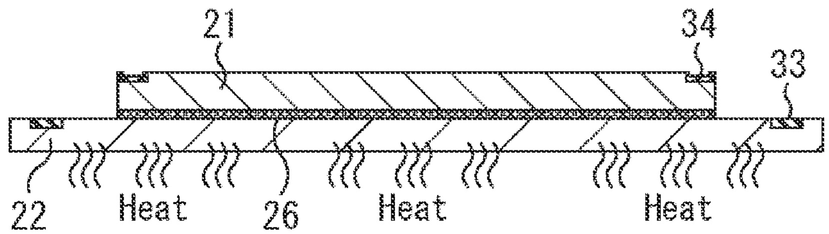

*FIG. 10*
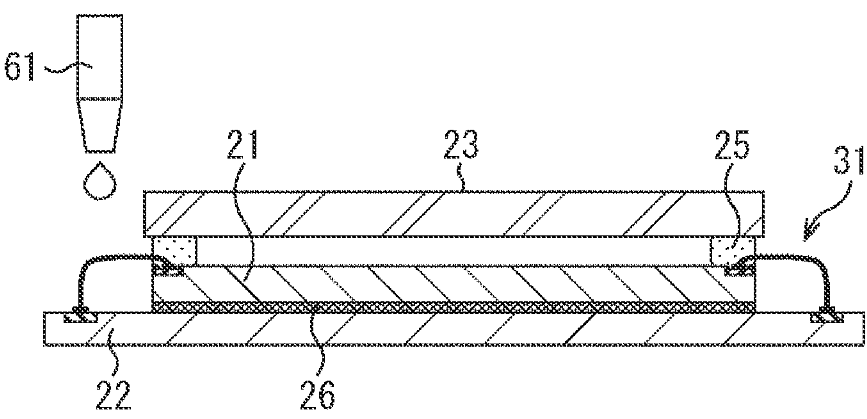
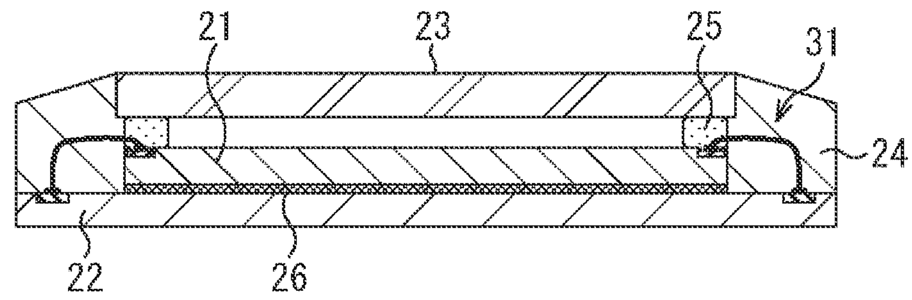
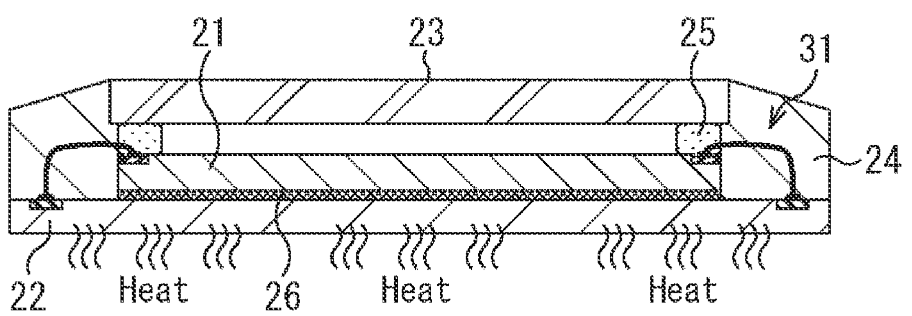

FIG. 11
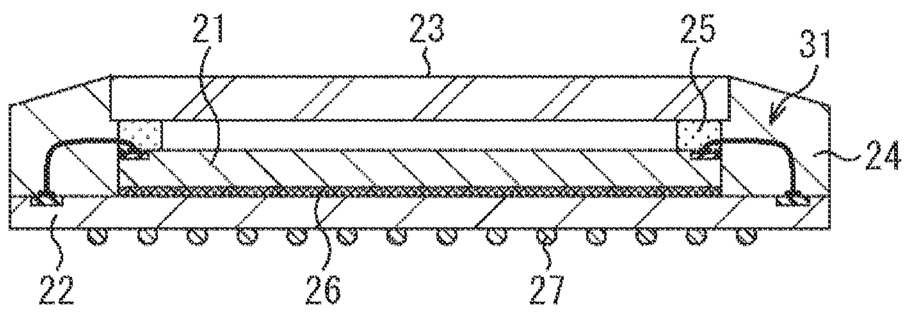
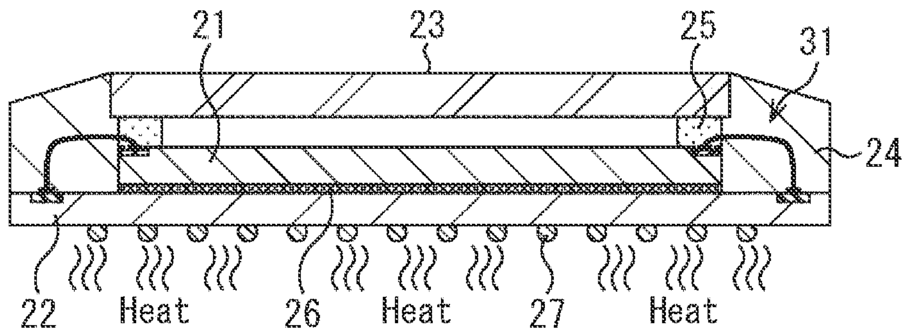

FIG. 14
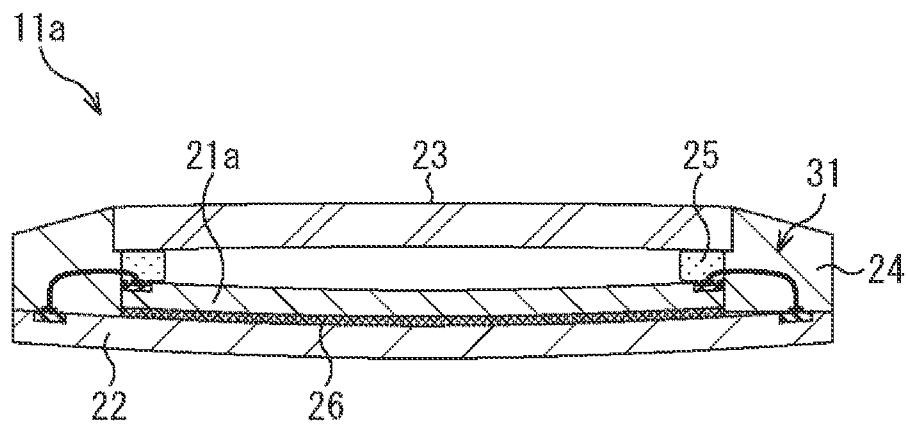
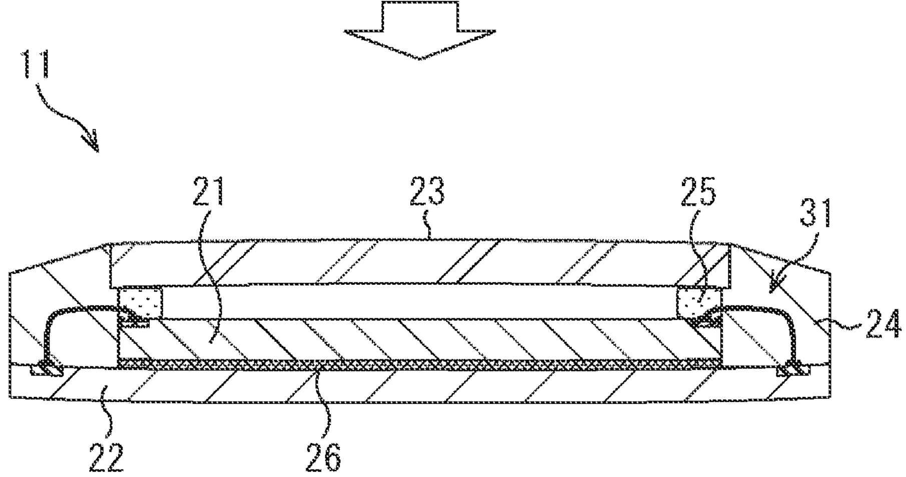

IMAGING ELEMENT PACKAGE, METHOD OF MANUFACTURING THE SAME, AND ELECTRONIC DEVICE

CROSS REFERENCE TO RELATED APPLICATIONS

This application is a national stage application under 35 U.S.C. 371 and claims the benefit of PCT Application No. PCT/JP2021/042006, having an international filing date of 16 Nov. 2021, which designated the United States, which PCT application claimed the benefit of Japanese Patent Application No. 2020-198486, filed 30 Nov. 2020, the entire disclosures of each of which are incorporated herein by reference.

TECHNICAL FIELD

The present disclosure relates to an imaging element package, a method of manufacturing the same, and an electronic device, and particularly to an imaging element package, a method of manufacturing the same, and an electronic device capable of further improving reliability.

BACKGROUND ART

Conventionally, in an imaging element package in which a chip such as a solid-state imaging element is mounted on a semiconductor mounting substrate and packaged so as to protect a sensor surface of the solid-state imaging element with a sealing glass, the solid-state imaging element and the semiconductor mounting substrate are connected by a wire wiring formed by wire bonding. For example, an imaging element package in which a plurality of solder balls is arranged in a lattice pattern on a lower surface of a semiconductor mounting substrate is referred to as a ball grid array (BGA).

For example, Patent Document 1 discloses a method of manufacturing an element package capable of reducing a height of an apex of a metal wire by performing wire bonding with two types of metal wires having different diameters.

CITATION LIST

Patent Document

Patent Document 1: Japanese Patent Application Laid-Open No. 2004-179303

SUMMARY OF THE INVENTION

Problems to be Solved by the Invention

Meanwhile, in the imaging element package, a resin sealing structure for sealing the wire wiring with resin is adopted. Conventionally, for example, a resin sealing structure has been adopted in an imaging element package using a thin solid-state imaging element having a thickness of about 175 μm. However, in such a thin solid-state imaging element, unevenness of heat generation of a logic circuit is great, and there is a concern that shading deteriorates due to generation of dark current. Furthermore, as a package size increases, stress generated at the time of processing such as reflow and thermocompression bonding increases, and as a result, there is also a concern that the sealing glass resin for packaging the sealing glass is peeled off.

Therefore, an imaging element package using a solid-state imaging element thicker than the conventional solid-state imaging element has been studied. However, in such an imaging element package, it is assumed that the stress on a stitch bond portion of the wire wiring increases as an amount of the sealing resin for sealing the wire wiring increases, and there is a concern that disconnection occurs in the wire wiring during processing such as reflow and thermocompression bonding. It is therefore required to avoid a risk of occurrence of disconnection in the wire wiring even when the amount of the sealing resin for sealing the wire wiring increases.

Furthermore, in the solid-state imaging element thicker than the conventional solid-state imaging element, it is assumed that a pad for bonding the wire wiring is provided at a deep position of the solid-state imaging element, and there is also a concern that the wire wiring interferes with a side surface of an opening provided so as to open the pad. It is therefore also required to avoid a risk of interference of the wire wiring.

The present disclosure is achieved in view of such a situation, and an object of the present disclosure is to avoid a risk of disconnection and interference of a wire wiring so as to further improve reliability.

Solutions to Problems

An imaging element package according to one aspect of the present disclosure includes a solid-state imaging element having a first pad, a substrate on which the solid-state imaging element is mounted, the substrate having a second pad, and a wire wiring that connects the first pad and the second pad by a metal wire, in which the wire wiring includes a ball portion bonded to the first pad in a shape having a thickness equal to or larger than a depth of an opening provided for opening the first pad in the solid-state imaging element, and a crescent portion provided by pressing an end of the metal wire against the ball portion and bonding the end to the ball portion, the crescent portion being connected to the metal wire with a connection length of a predetermined ratio or more with respect to the metal wire.

A manufacturing method according to one aspect of the present disclosure is a method of manufacturing an imaging element package including a solid-state imaging element having a first pad, a substrate on which the solid-state imaging element is mounted, the substrate having a second pad, and a wire wiring that connects the first pad and the second pad by a metal wire, the method including bonding a ball portion to the first pad in a shape having a thickness equal to or larger than a depth of an opening provided for opening the first pad in the solid-state imaging element, and connecting a crescent portion provided by pressing an end of the metal wire against the ball portion and bonding the end to the ball portion with a connection length of a predetermined ratio or more with respect to the metal wire.

In an electronic device according to one aspect of the present disclosure, the electronic device including an imaging element package, the imaging element package includes a solid-state imaging element having a first pad, a substrate on which the solid-state imaging element is mounted, the substrate having a second pad, and a wire wiring that connects the first pad and the second pad by a metal wire, the wire wiring includes a ball portion bonded to the first pad in a shape having a thickness equal to or larger than a depth of an opening provided for opening the first pad in the solid-state imaging element, and a crescent portion provided by pressing an end of the metal wire against the ball portion and bonding the end to the ball portion, the crescent portion being connected to the metal wire with a connection length of a predetermined ratio or more with respect to the metal wire.

In one aspect of the present disclosure, a ball portion is bonded to the first pad in a shape having a thickness equal to or larger than a depth of an opening portion provided for opening the first pad in the solid-state imaging element, and a crescent portion provided by pressing an end of the metal wire against the ball portion and bonding the end to the ball portion is connected to the metal wire with a connection length of a predetermined ratio or more with respect to the metal wire.

BRIEF DESCRIPTION OF DRAWINGS

FIG. 5 is a diagram for describing shapes and problems of the wire wiring.

FIG. 6 is a diagram for describing a die bonding process in a method of manufacturing the imaging element package.

FIG. 10 is a diagram for describing a sealing resin process in the method of manufacturing the imaging element package.

FIG. 11 is a diagram for describing a solder ball process in the method of manufacturing the imaging element package.

FIG. 14 is a diagram for describing deformation occurring in the imaging element package.

MODE FOR CARRYING OUT THE INVENTION

Hereinafter, a specific embodiment to which the present technology is applied will be described in detail with reference to the drawings.

<Configuration Example of Imaging Element Package>

Figure 1:
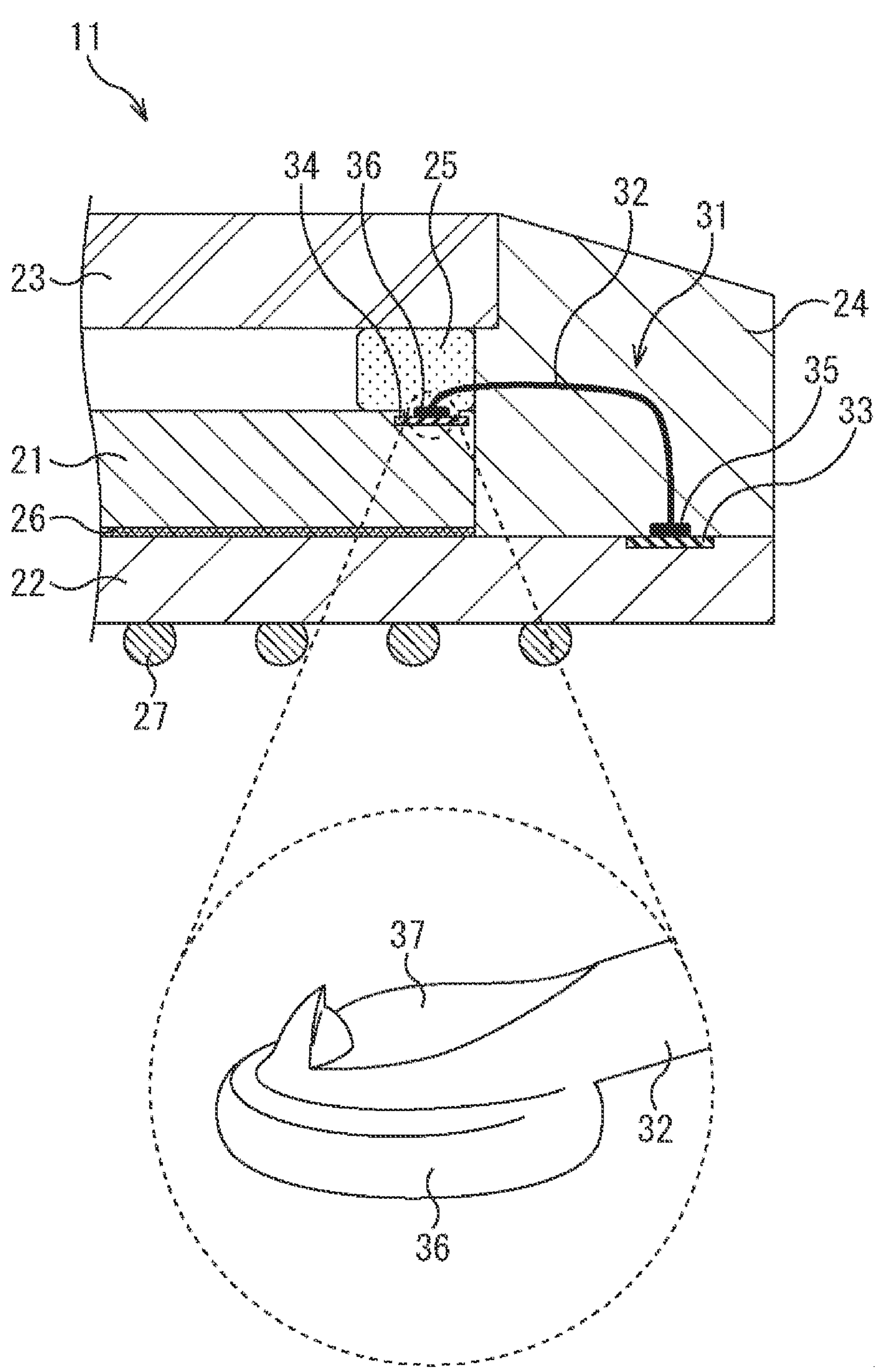
FIG. 1 is a diagram showing a configuration of one embodiment of an imaging element package to which the present technology is applied.

FIG. 1 is a block diagram showing a configuration example of an embodiment of an imaging element package to which the present technology is applied.

An imaging element package 11 shown in FIG. 1 includes a solid-state imaging element 21, a semiconductor mounting substrate 22, a sealing glass 23, a sealing resin 24, a sealing glass resin 25, a die bond resin 26, and solder balls 27. Furthermore, in the imaging element package 11, the solid-state imaging element 21 and the semiconductor mounting substrate 22 are connected by a wire wiring 31.

The solid-state imaging element 21 is, for example, a charge coupled device (CCD) image sensor, a complementary metal oxide semiconductor (CMOS) image sensor, or the like, and has a sensor surface in which a plurality of pixels is arranged in an array.

Figure 2:
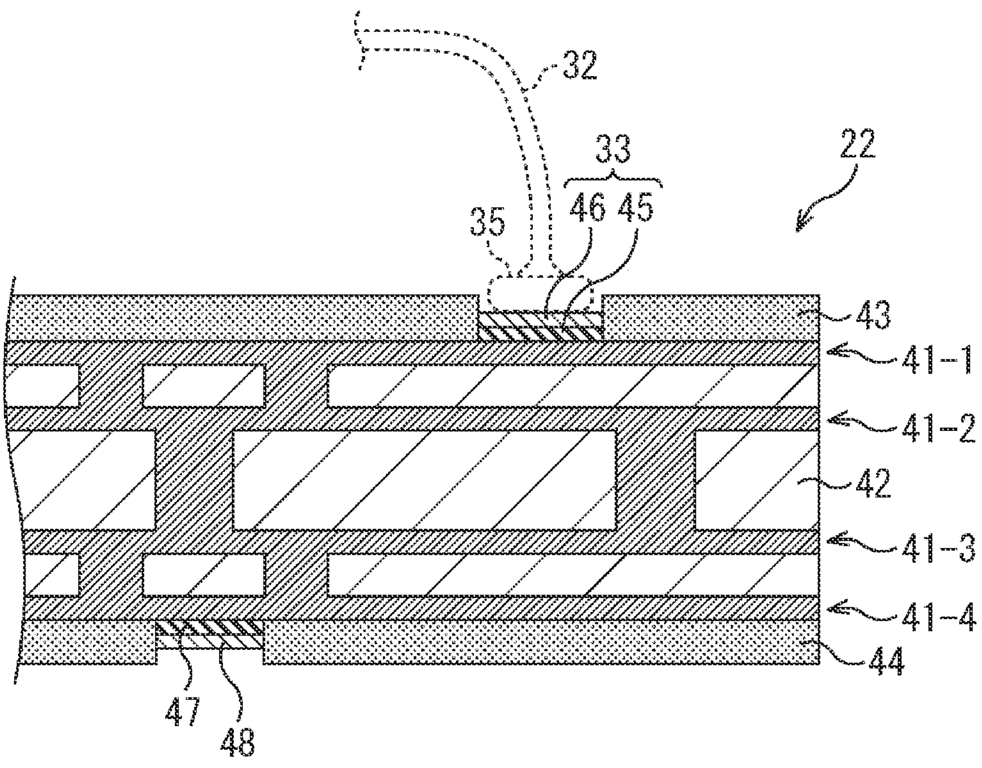
FIG. 2 is a sectional view showing a configuration example of a semiconductor mounting substrate.

The semiconductor mounting substrate 22 is a substrate no which the solid-state imaging element 21 is mounted. As shown in FIG. 2, the semiconductor mounting substrate 22 is formed by stacking a plurality of layers of wirings 41 (in the example shown in FIG. 2, four layers of wirings 41-1 to 41-4) inside a prepreg 42 including glass cloth and resin. On the upper surface of the semiconductor mounting substrate 22, an insulating film 43 such as a solder resist is formed, and a pad 33 including a nickel layer 45 and a gold plating layer 46 for bonding the wire wiring 31 is provided. On the lower surface of the semiconductor mounting substrate 22, an insulating film 44 such as a solder resist is formed, and a nickel layer 47 and a gold plating layer 48 for bonding the solder balls 27 are provided.

The sealing glass 23 is a glass substrate for protecting the sensor surface of the solid-state imaging element 21.

The sealing resin 24 is provided so as to surround outer peripheries of side surfaces of the solid-state imaging element 21 and the sealing glass 23, and is a resin member for sealing the wire wiring 31. For example, as the sealing resin 24, an epoxy-based resin that starts to be cured at 50° C. or higher can be adopted.

The sealing glass resin 25 is used to package the sealing glass 23 on the solid-state imaging element 21. For example, as the sealing glass resin 25, a mixed resin obtained by mixing an acrylic-based resin and an epoxy-based resin that is temporarily cured at an ultraviolet amount of 1 J/cm 2 or more and starts to be thermally cured at 50° C. or higher can be adopted, and curing is performed by ultraviolet rays and heat.

The die bond resin 26 is used to package the solid-state imaging element 21 on the semiconductor mounting substrate 22. For example, as the die bond resin 26, an acrylic resin, an epoxy resin, or a silicone resin that starts to be cured at 50° C. or higher can be adopted.

The solder balls 27 are used when the imaging element package 11 is packaged on an electronic device such as an imaging device. As the solder material, for example, lead-free solder (for example, Sn-3.0Ag-0.5Cu) having a melting point of about 220° C. can be adopted.

The wire wiring 31 connects the pad 33 provided on the semiconductor mounting substrate 22 and a pad 34 provided on the solid-state imaging element 21 by a metal wire 32. As the metal wire 32, for example, a gold cord having a diameter of 25 μm is used. In addition, a ball portion 35 is provided at a joint where the metal wire 32 is bonded to the pad 33, and a ball portion 36 is provided at a joint where the metal wire 32 is bonded to the pad 34.

Furthermore, as shown in an enlarged manner on the lower side of FIG. 1, a crescent portion 37 is provided between the ball portion 36 and the metal wire 32. The ball portion 36 is formed in a shape in which a stud bump bonded to the pad 34 is pressed when wire bonding for forming the wire wiring 31 is performed. The crescent portion 37 is formed in a shape in which an end of the metal wire 32 is bonded to the ball portion 36 by pressing the end of the metal wire 36 against the ball portion.

The ball portion 36 and the crescent portion 37 of the wire wiring 31 will be described in detail with reference to the enlarged view shown in FIG. 3. A of FIG. 3 shows a schematic configuration example in which the ball portion 36 and the crescent portion 37 are viewed in a plan view, and B of FIG. 3 shows a schematic configuration example in which the ball portion 36 and the crescent portion 37 are viewed in a sectional view.

Figure 3:
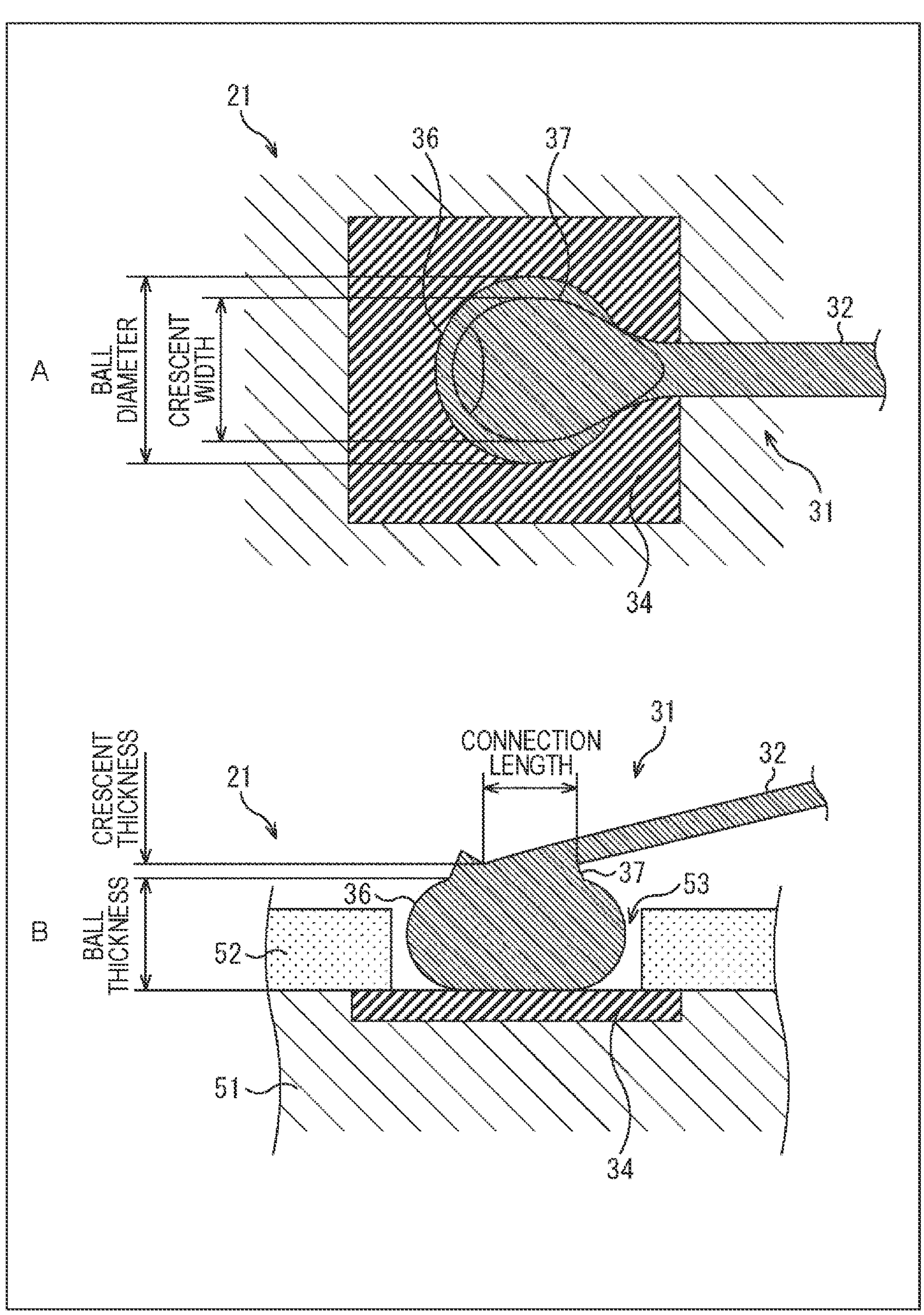
FIG. 3 is an enlarged view showing an example of a ball portion and a crescent portion of a wire wiring.

As shown in B of FIG. 3, the solid-state imaging element 21 has a configuration in which an insulating layer 52 is stacked on a semiconductor substrate 51, and an opening 53 is formed in a part of the insulating layer 52 so that the pad 34 provided on the semiconductor substrate 51 opens. For example, the thickness of the solid-state imaging element 21 is 400 μm or more, and the depth of the opening 53 is 8 μm or more.

For example, as will be described later with reference to FIG. 7, after the stud bump to be the ball portion 36 is formed so as to be bonded to the pad 34, the end of the metal wire 32 is pressed against the stud bump to be fixed, and the metal wire 32 is torn to form the ball portion 36 and the crescent portion 37. Then, the shapes of the ball portion 36 and the crescent portion 37 are determined by capillary indentation formed when the metal wire 32 is pressed against the stud bump. For example, as a pressure at the time of pressing the end of the metal wire 32 against the stud bump increases, a ball diameter of the ball portion 36 increases and a ball thickness of the ball portion 36 decreases.

As shown in A of FIG. 3, in a plan view of the solid-state imaging element 21, a length of the ball portion 36 in a direction orthogonal to a direction along the metal wire 32 is defined as the ball diameter, and a length of the crescent portion 37 in the direction orthogonal to the direction along the metal wire 32 is defined as a crescent width. As shown in B of FIG. 3, in a sectional view of the solid-state imaging element 21, a height from the pad 34 to a boundary between the ball portion 36 and the crescent portion 37 is defined as the ball thickness, and a height from the boundary between the ball portion 36 and the crescent portion 37 to an apex of the crescent portion 37 is defined as a crescent thickness. In addition, a length from the apex of the crescent portion 37 to the boundary between the metal wire 32 and the crescent portion 37 in the direction along the metal wire 32 is defined as a connection length. Note that the apex of the crescent portion 37 is the deepest point of a recess formed on an upper surface of the crescent portion 37 by the capillary indentation.

In the imaging element package 11, the ball portion 36 is formed in a shape having a thickness equal to or larger than the depth of the opening 53. In addition, the crescent portion 37 is formed so as to have the connection length of a predetermined ratio (for example, as shown in FIG. 5, 2/3) or more with respect to the metal wire 32. Therefore, in the imaging element package 11, a risk of the metal wire 32 interfering with the insulating layer 52 can be avoided, and a risk of occurrence of disconnection can be avoided by improving a bonding strength between the metal wire 32 and the crescent portion 37.

Here, the shapes of the ball portion 36 and the crescent portion 37 of the wire wiring 31 using the conventional technology will be described with reference to FIG. 4.

Figure 4:
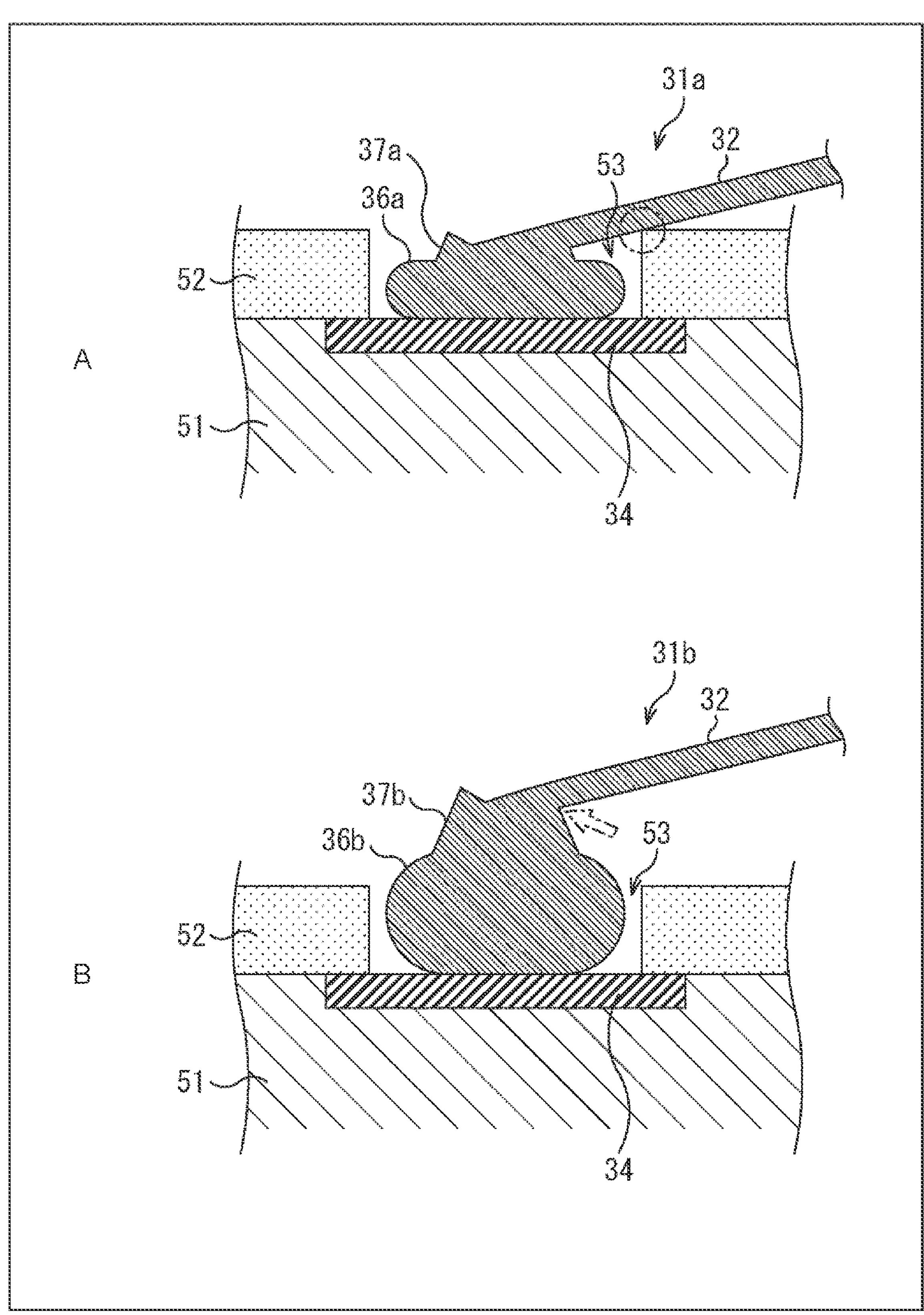
FIG. 4 is a diagram showing an example of shapes of a ball portion and a crescent portion of a wire wiring using a conventional technology.

A of FIG. 4 shows a schematic sectional view of a ball portion **36*a* and a crescent portion 37*a* of a wire wiring 31*a* using a conventional technology 1**.

In the conventional technology 1, the crescent portion **37*a* is formed so that the connection length increases as the ball portion 36*a* is formed so that the ball thickness decreases. As described above, in a case where the ball thickness of the ball portion 36*a* is thin, there is a risk that the metal wire 32 interferes with the insulating layer 52 at a portion indicated by a circle of an alternate long and short dash line. In addition, since the ball thickness of the ball portion 36*a* is thin, there is a concern that damage may occur below the pad 34 due to a load pressing the capillary when the crescent portion 37*a*** is formed.

B of FIG. 4 shows a schematic sectional view of a ball portion **36*b* and a crescent portion 37*b* of a wire wiring 31*b* using a conventional technology 2**.

In the conventional technology 2, the crescent portion **37*b* is formed so that the connection length decreases as the ball portion 36*b* is formed so that the ball thickness increases. As described above, in a case where the connection length of the crescent portion 37*b* is short, there is a concern that disconnection may occur at a connection portion between the metal wire 32 and the crescent portion 37*b*** at a neck indicated by a dashed-dotted line arrow.

FIG. 5 collectively shows the shapes and problems of the wire wiring 31 to which the present technology is applied, the wire wiring **31*a* using the conventional technology 1, and the wire wiring 31*b* using the conventional technology 2**.

For example, in the wire wiring 31 to which the present technology is applied, the ball portion 36 is formed in a thick shape in which the ball thickness is about 14 μm and the ball diameter is about 66 μm in terms of the ball thickness with respect to the ball diameter. Note that the ball thickness may be any thickness equal to or larger than the above thickness. The ball is formed in a thin shape in which the crescent thickness is about 10 μm and the ball diameter is about 66 μm in terms of the crescent thickness with respect to the ball diameter. Note that the crescent thickness may be any thickness equal to or less than the above thickness. The ball portion 36 and the crescent portion 37 are formed in a wide shape in which the crescent width is about 40 μm and the ball diameter is about 66 μm in terms of the crescent width with respect to the ball diameter. Note that the crescent width may be any length equal to or larger than the above width. The ball portion 36 and the crescent portion 37 are formed in a long shape in which the connection length with respect to the ball diameter is about ⅔ or more in terms of the connection length with respect to the ball diameter.

Therefore, as for the problem of reducing the height of the wire wiring 31 to which the present technology is applied, it has been confirmed that the thickness of the sealing glass resin 25 falls within about 150 μm, for example. As for the problem that the depth of the opening 53 corresponds to the pad 34 having a large depth, for example, it has been confirmed that interference does not occur when the depth of the opening 53 is about 8 μm or more. As for the problem of not damaging the lower side of the pad 34, it has been confirmed that no damage is caused after bonding. As for the problem of coping with the solid-state imaging element 21 having a larger thickness, it has been confirmed that, for example, in the solid-state imaging element 21 having a thickness of 400 μm or more, a trouble such as disconnection in the metal wire 32 in reflow at 260° C. does not occur.

On the other hand, since the capillary presses and crushes the stud bump in the wire wiring **31*a* using the conventional technology 1, the ball thickness with respect to the ball diameter is thinner than in the wire wiring 31** to which the present technology is applied. Therefore, in the wire wiring

31*a* using the conventional technology 1, there is a risk of interference with a side wall of the opening 53 as for the problem that the depth of the opening 53 corresponds to the pad 34 having a large depth. In addition, as for the problem of not damaging the lower side of the pad 34, there is risk of damage due to a high load. Furthermore, as for the problem of coping with the solid-state imaging element 21 having a larger thickness, there is a disconnection risk due to the thin neck.

In addition, the crescent thickness with respect to the ball diameter is thicker, the crescent width with respect to the ball diameter is narrower, and the connection length with respect to the ball diameter is shorter in the wire wiring 31*b* using the conventional technology 2 than in the wire wiring 31 to which the present technology is applied. Thus, in the wire wiring 31*b* using the conventional technology 2, there is a concern that disconnection of the metal wire 32 may at the time of reflow as for the problem of coping with the solid-state imaging element 21 having a larger thickness.

Therefore, the wire wiring 31 to which the present technology is applied can solve all the problems as shown in FIG. 5 as compared with the wire wiring 31*a* using the conventional technology 1 and the wire wiring 31*b* using the conventional technology 2. As a result, the wire wiring 31 to which the present technology is applied can improve reliability more than before, for example, by avoiding the risks of disconnection, interference of the metal wire 32, and the like.

<Method of Manufacturing Imaging Element Package>

A method of manufacturing the imaging element package 11 will be described with reference to FIGS. 6 to 11.

FIG. 6 is a diagram for describing a die bonding process.

As shown in a first stage of FIG. 6, in a first step, a die bond material is applied from a nozzle 61 to the upper surface of the semiconductor mounting substrate 22 to form the die bond resin 26. Note that the semiconductor mounting substrate 22 has the configuration described above with reference to FIG. 2, and the pad 33 is formed on the upper surface of the semiconductor mounting substrate 22.

As shown in a second stage of FIG. 6, in a second step, the solid-state imaging element 21 is packaged on the semiconductor mounting substrate 22 by bringing the solid-state imaging element 21 into close contact with the die bond resin 26.

As shown in a third stage of FIG. 6, in a third step, heat treatment is performed to thermally cure the die bond resin 26. For example, as a curing condition of the die bond resin 26, the heat treatment is preferably performed in a temperature range of 50° C. to 200° C. and a time range of one minute to ten hours.

Such a die bonding process can fix the solid-state imaging element 21 to the semiconductor mounting substrate 22.

Figure 7:
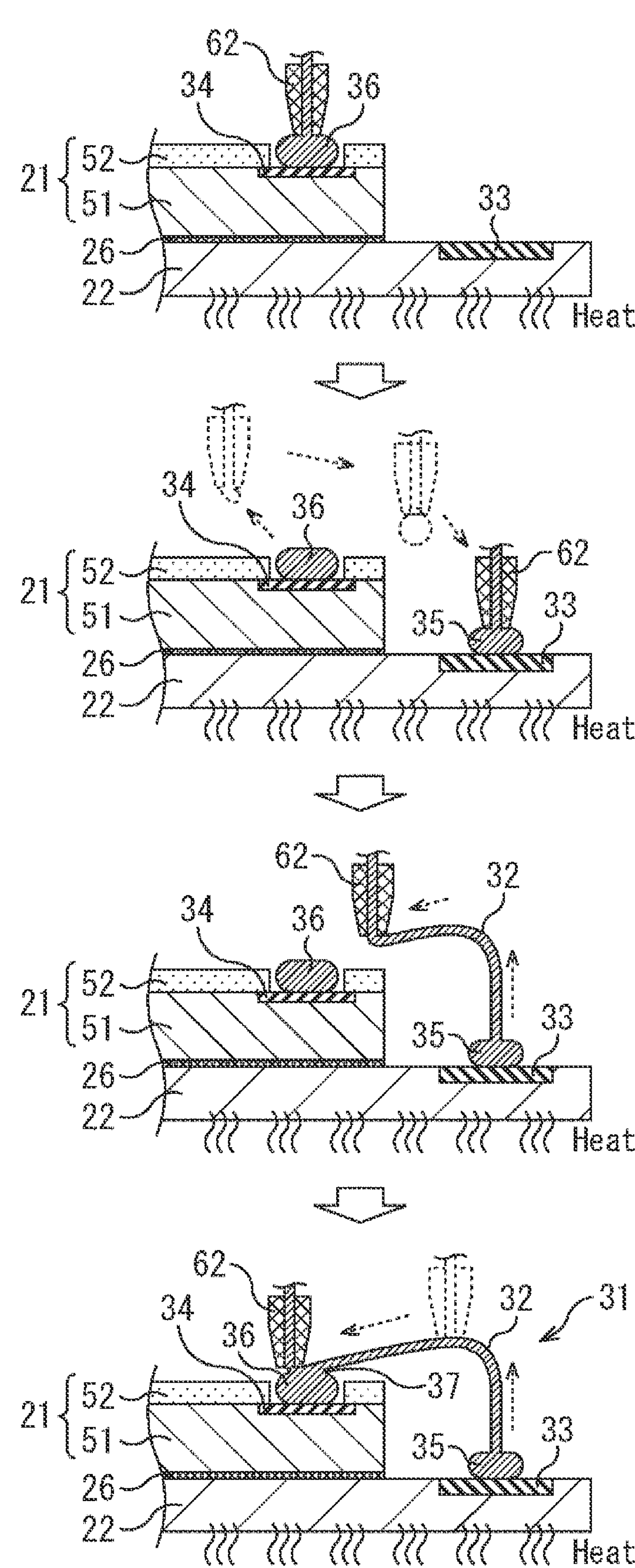
FIG. 7 is a diagram for describing a wire bonding process in the method of manufacturing the imaging element package.

FIG. 7 is a diagram for describing a wire bonding process. Note that, in the wire bonding process, assembly is preferably performed in a state where heating (for example, 130° C. or higher) is performed from a bottom surface of the semiconductor mounting substrate 22 in terms of bondability.

As shown in a first stage of FIG. 7, in a fourth step, a metal wire is unwound from a capillary 62 above the pad 34 to form a stud bump to be the ball portion 36 so as to be bonded to the pad 34.

As shown in a second stage of FIG. 7, in a fifth step, after the capillary 62 is moved above the pad 33, the metal wire is unwound from the capillary 62 to form a second bond to be the ball portion 35 so as to be bonded to the pad 33.

As shown in a third stage of FIG. 7, in a sixth step, the capillary 62 is moved upward while the metal wire is continuously unwound from the capillary 62, and then moved toward the pad 34 to perform looping for forming the metal wire 32.

As shown in a fourth stage of FIG. 7, in a seventh step, the end of the metal wire 32 is pressed against the ball portion 36 by the capillary 62, and stitch bonding is performed to bond the end to the ball portion 36, and thus the crescent portion 37 is formed. Thereafter, the capillary 62 is pulled up in a state where the feeding of the metal wire is stopped, and thus the metal wire 32 is torn off to form the wire wiring 31.

Here, the pressing by the capillary 62 will be described with reference to an enlarged view shown in FIG. 8. A of FIG. 8 shows a schematic configuration example in which the ball portion 36 and the crescent portion 37 are viewed in a plan view, and B of FIG. 8 shows a schematic configuration example in which the ball portion 36 and the crescent portion 37 are viewed in a sectional view.

Figure 8:
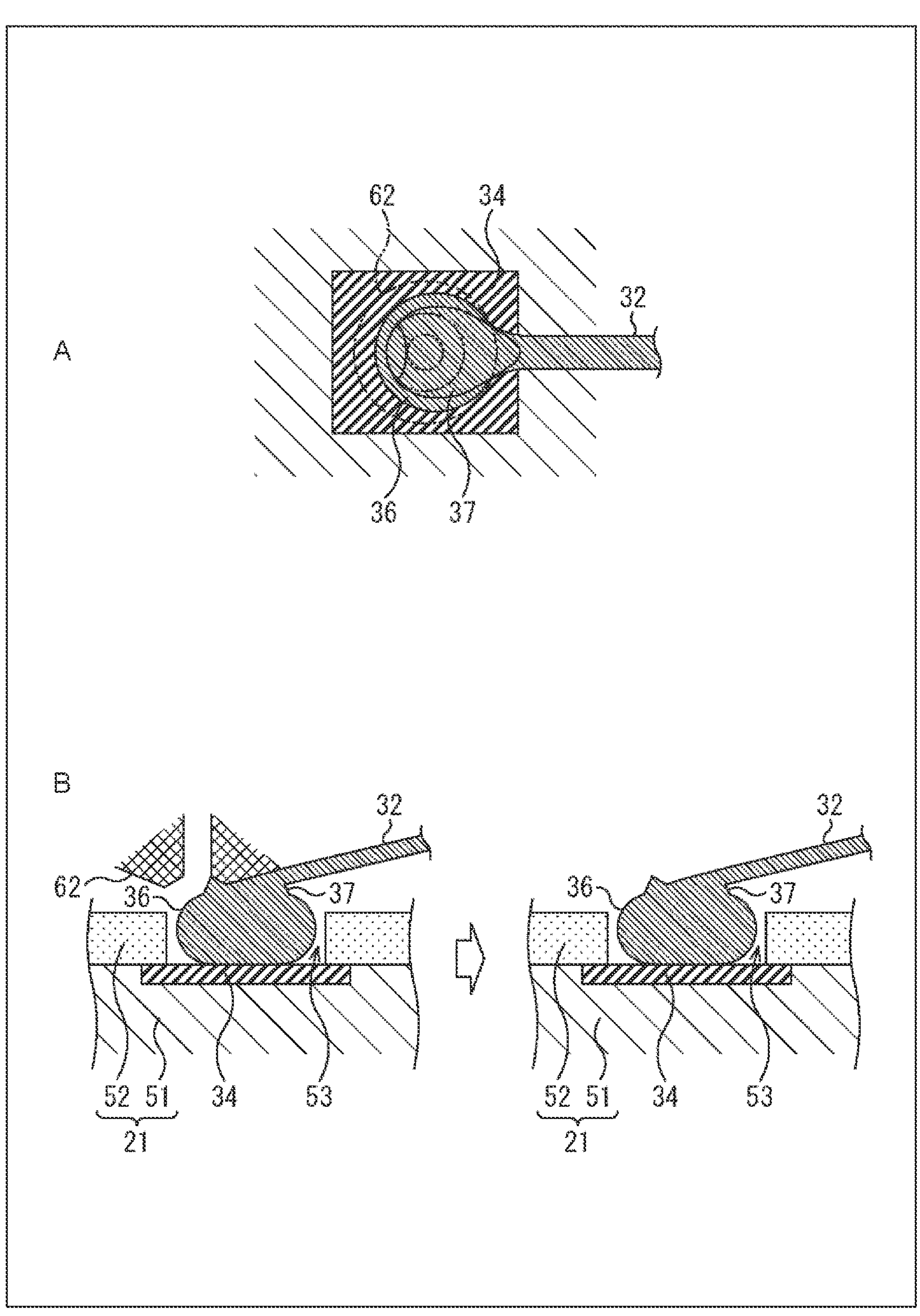
FIG. 8 is an enlarged view for describing pressing by a capillary.

For example, in A of FIG. 8, the position of the capillary 62 when the end of the metal wire 32 is pressed against the ball portion 36 is indicated by a two-dot chain line. That is, the capillary 62 presses the end of the metal wire 32 against the ball portion 36 at a position as shown on the left side of B of FIG. 8. As a result, as shown on the right side of B of FIG. 8, the crescent portion 37 in which the capillary indentation is formed is formed.

Such a wire bonding process can form the wire wiring 31. At this time, by forming the ball portion 36 and the crescent portion 37 so as to have the shapes described above with reference to FIG. 5, reliability can be further improved. For example, by pressing the capillary 62 so that the connection length with respect to the ball diameter is about ⅔ or more to form the ball portion 36 and the crescent portion 37, the bonding strength between the metal wire 32 and the crescent portion 37 can be increased, and the occurrence of disconnection at the neck can be avoided.

Figure 9:
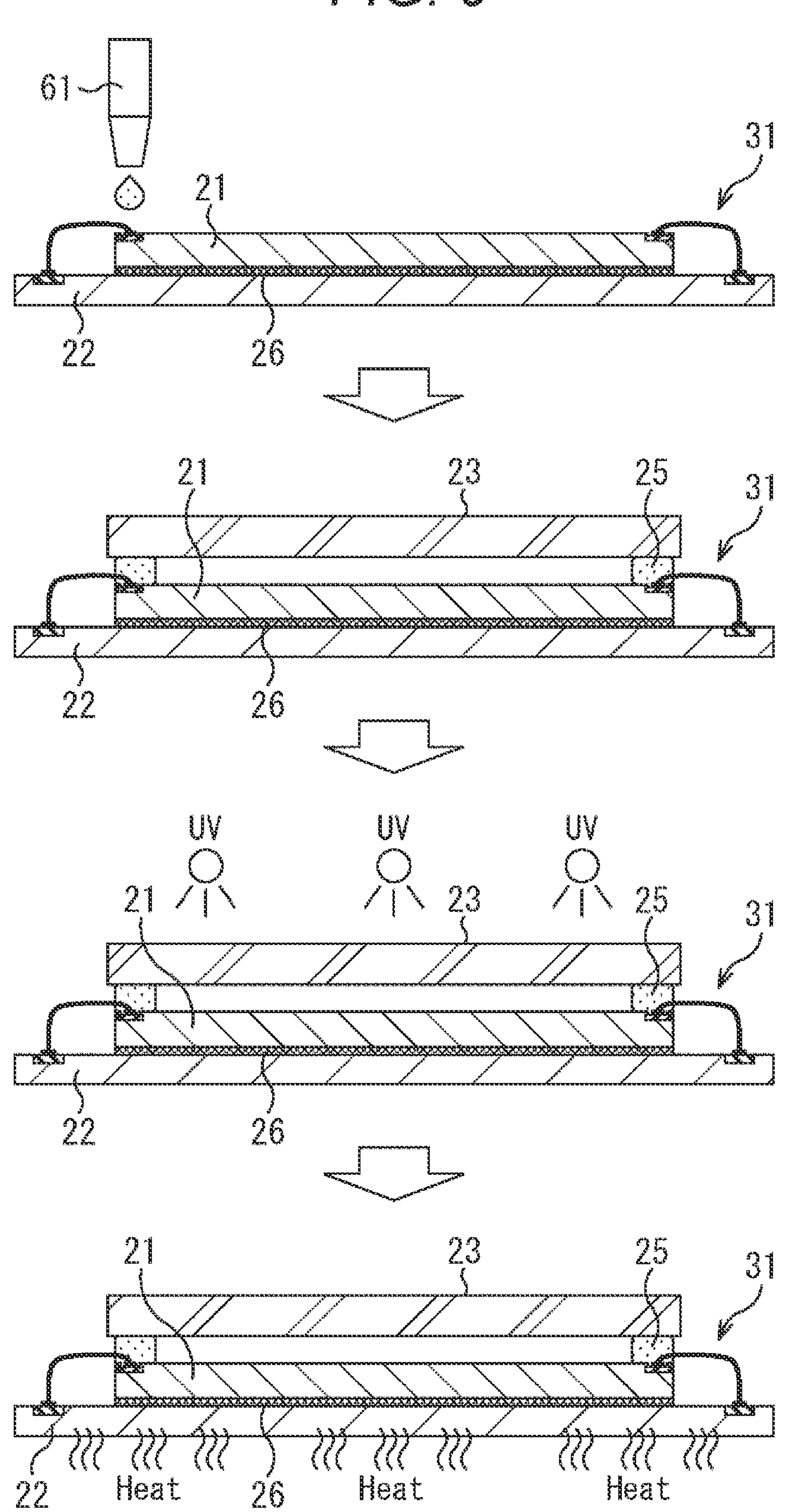
FIG. 9 is a diagram for describing a sealing glass process in the method of manufacturing the imaging element package.

FIG. 9 is a diagram for describing a sealing glass process.

As shown in a first stage of FIG. 9, in an eighth step, a resin material to be the sealing glass resin 25 is applied from the nozzle 61 along an outer periphery outside the sensor surface of the solid-state imaging element 21.

As shown in a second stage of FIG. 9, in a ninth step, the sealing glass 23 is packaged by bringing the sealing glass 23 into close contact with the sealing glass resin 25.

As shown in a third stage of FIG. 9, in a tenth step, the sealing glass resin 25 is temporarily cured by irradiating the sealing glass resin with ultraviolet rays, and the sealing glass 23 is simply adhered to the sealing glass resin 25. For example, by this simple adhesion, the sealing glass resin 25 has such an adhesive force that the sealing glass 23 does not move during transportation. For example, as a curing condition of the sealing glass resin 25, it is preferable to perform an ultraviolet curing treatment of an ultraviolet ray including a wavelength of 365 nm in a range of an ultraviolet ray amount of 1 $J/cm^2$ to 10 $J/cm^2$.

As shown in a fourth stage of FIG. 9, in an eleventh step, the sealing glass resin 25 is thermally cured by performing a heat treatment, and the sealing glass 23 is completely adhered to the sealing glass resin 25. That is, the sealing glass resin 25 is fully cured to have high adhesive strength. For example, as a curing condition of the sealing glass resin 25, the heat treatment is preferably performed in a temperature range of 50° C. to 200° C. and a time range of one minute to ten hours.

Such a sealing glass process can fix the sealing glass 23 to the solid-state imaging element 21.

FIG. 10 is a diagram for describing a sealing resin process.

As shown in a first stage of FIG. 10, in a twelfth step, a resin material to be the sealing resin 24 is applied from the nozzle 61 so as to cover side surfaces of the solid-state imaging element 21, the semiconductor mounting substrate 22, and the sealing glass resin 25 and to entirely fill the wire wiring 31 outside the sealing glass resin 25.

As shown in a second stage of FIG. 10, in a thirteenth step, the sealing resin 24 is formed by the resin material applied from the nozzle 61 to perform resin sealing of the wire wiring 31.

As shown in a third stage of FIG. 10, in a fourteenth step, the sealing resin 24 is cured by performing an oven thermal curing treatment at 50° C. or higher. For example, as a curing condition of the sealing resin 24, the heat treatment is preferably performed in a temperature range of 50° C. to 200° C. and a time range of one minute to ten hours.

Such a sealing resin process can form the sealing resin 24 and seal the wire wiring 31.

FIG. 11 is a diagram for describing a solder ball process.

As shown in a first stage of FIG. 11, in a fifteenth step, the solder balls 27 are packaged on the gold plating layer 48 (see FIG. 2) on the lower surface of the semiconductor mounting substrate 22.

As shown in a second stage of FIG. 11, in a sixteenth step, by performing a reflow heating treatment at 220° C. or higher, the solder balls 27 are once melted to form an alloy at an interface between the nickel layer 47 and the gold plating layer 48 on the lower surface of the semiconductor mounting substrate 22.

Such a solder ball process can bond the solder balls 27 to the semiconductor mounting substrate 22.

The imaging element package 11 can be manufactured by a manufacturing method including each process as described above. For example, even if heat treatment such as reflow or thermocompression bonding is performed in such a manufacturing method, disconnection of the metal wire 32 is avoided, and thus the reliability of the imaging element package 11 can be improved.

Expansion and contraction of the sealing resin 24 according to a difference in thickness of the solid-state imaging element 21 will be described with reference to FIG. 12.

Figure 12:
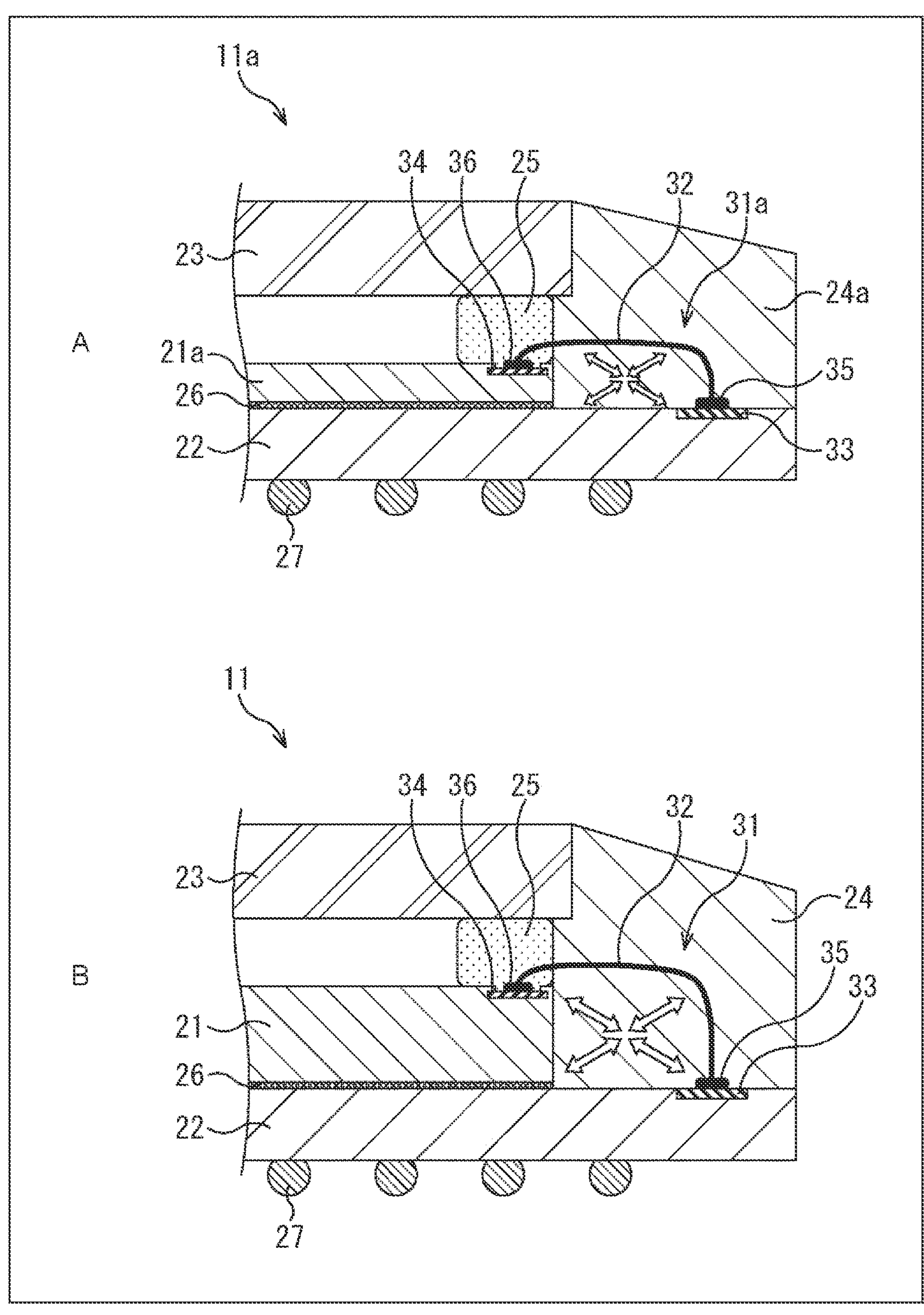
FIG. 12 is a diagram for describing expansion and contraction of a sealing resin.

A of FIG. 12 shows a configuration example of a section near a sealing resin 24*a* in an imaging element package 11*a* using a solid-state imaging element 21*a* having a thickness of 175 μm. B of FIG. 12 shows a configuration example of a section near the sealing resin 24 in the imaging element package 11 using the solid-state imaging element 21 having a thickness of 400 μm.

As shown in the drawing, a resin amount of the sealing resin 24*a* is small in the configuration using the thin solid-state imaging element 21*a*, whereas a resin amount of the sealing resin 24 is large in the configuration using the thick solid-state imaging element 21. Therefore, at the time of processing such as reflow and thermocompression bonding, as indicated by white arrows, a displacement caused by the expansion and contraction of the sealing resin 24 on the wire wiring 31 is larger than a displacement caused by the expansion and contraction of the sealing resin 24*a* on the wire wiring 31*a*.

As described above, the imaging element package 11 can improve the bonding strength between the metal wire 32 and the crescent portion 37. Therefore, in the imaging element package 11, even if stress (strain) applied to the wire wiring 31 due to the expansion and contraction of the sealing resin 24 increases, it is possible to avoid occurrence of disconnection at the neck between the metal wire 32 and the crescent portion 37.

The influence of deformation occurring in the imaging element package 11 when reflow is performed will be described with reference to FIGS. 13 and 14.

Figure 13:
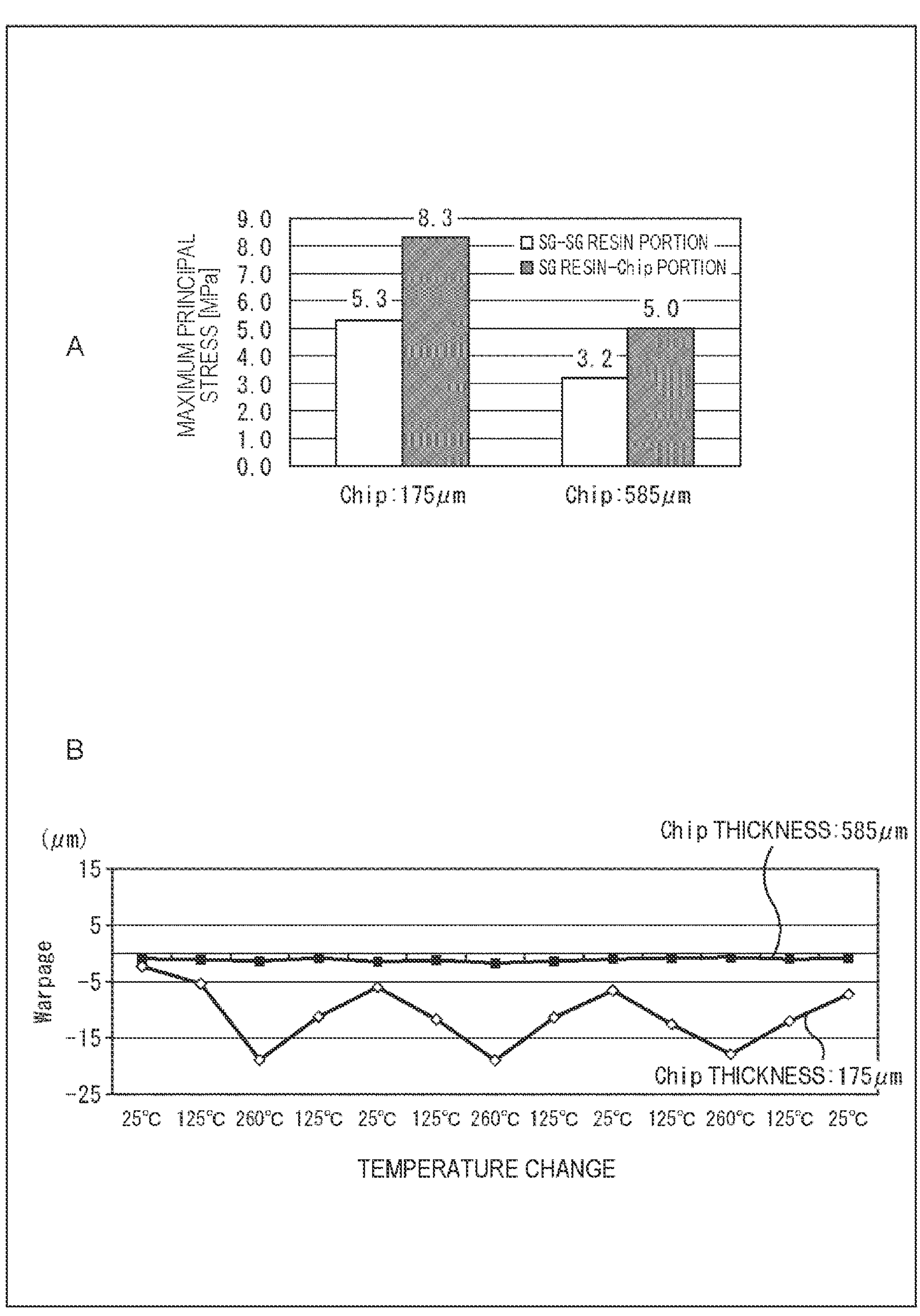
FIG. 13 is a diagram for describing simulation results of stress and an amount of warpage.

A of FIG. 13 shows simulation results of stress generated when reflow is performed at 260° C., and B of FIG. 13 shows simulation results of an amount of warpage generated when reflow is performed at 260° C. FIG. 14 schematically shows deformation occurring in the imaging element packages 11 and 11*a* in accordance with these simulation results.

As shown in A of FIG. 13, a simulation result is obtained in which the stress generated in the imaging element package 11 using the solid-state imaging element 21 having a thickness of 585 μm is reduced by about 40% from the stress generated in the imaging element package 11*a* using the solid-state imaging element 21*a* having a thickness of 175 μm.

For example, in the imaging element package 11*a*, a simulation result is obtained in which the stress generated on a bonding surface between the sealing glass 23 and the sealing glass resin 25 is 5.3 MPa, and the stress generated on a bonding surface between the sealing glass resin 25 and the solid-state imaging element 21*a* is 8.3 MPa. On the other hand, in the imaging element package 11, a simulation result is obtained in which the stress generated on the bonding surface between the sealing glass 23 and the sealing glass resin 25 is reduced to 3.2 MPa, and the stress generated on the bonding surface between the sealing glass resin 25 and the solid-state imaging element 21*a* is reduced to 5.0 MPa.

As shown in B of FIG. 13, in the imaging element package 11*a* using the solid-state imaging element 21*a* having a thickness of 175 μm, the amount of warpage greatly changes in accordance with a temperature change at the time of reflow. On the other hand, in the imaging element package 11 using the solid-state imaging element 21 having a thickness of 585 μm, a simulation result in which the amount of warpage is significantly reduced is obtained.

On the basis of such a simulation result, as shown in FIG. 14, deformation generated when reflow is performed is large in the imaging element package 11*a* using the thin solid-state imaging element 21*a*, whereas deformation generated when reflow is performed is small in the imaging element package 11 using the thick solid-state imaging element 21. Then, by suppressing deformation generated at the time of reflow, in the imaging element package 11, stress to each interface of the sealing glass 23 is reduced, and as a result, it is possible to avoid peeling of the sealing glass resin 25.

A configuration example of the solid-state imaging element 21 having a two-layer structure will be described with reference to FIG. 15.

Figure 15:
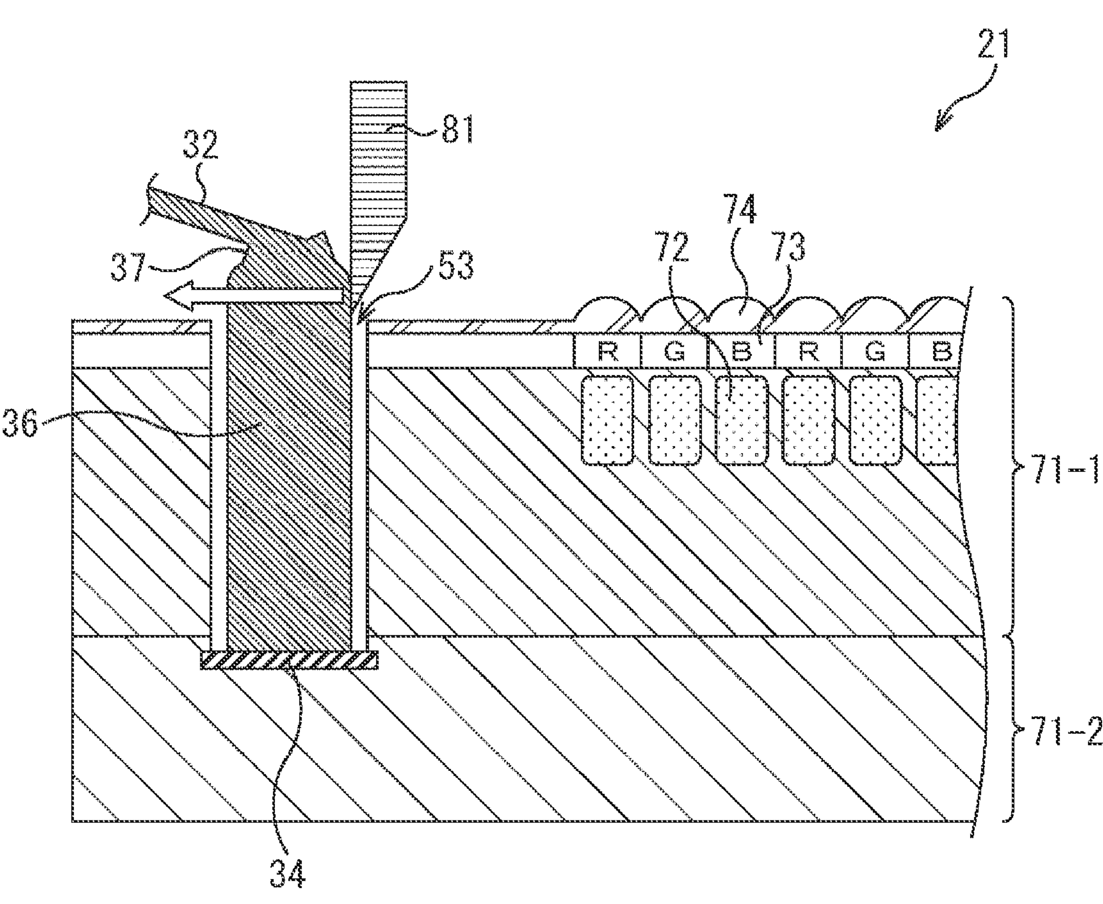
FIG. 15 is a diagram showing a configuration example of a solid-state imaging element having a two-layer structure.

The solid-state imaging element 21 can adopt a multilayer structure, and FIG. 15 shows an example in which a two-layer structure in which two-layer semiconductor substrates 71-1 and 71-2 are stacked is adopted. For example, the semiconductor substrate 71-1 is a sensor substrate on which a sensor surface is provided, and the semiconductor substrate 71-2 is a logic substrate on which a logic circuit is provided. As shown in the drawing, the semiconductor substrate 71-1 as a sensor substrate is provided with a photodiode 72, a color filter 73, and an on-chip microlens 74 for every pixel.

As described above, in some cases, the solid-state imaging element 21 having the two-layer structure has a configuration in which the pad 34 is provided on the semiconductor substrate 71-2, and the depth of the opening 53 for opening the pad 34 becomes deeper. Accordingly, the ball portion 36 that needs to have a thickness equal to or larger than the depth of the opening 53 is formed in a thicker shape.

For example, in a sampling inspection in in process quality control (IPQC), generally, the vicinity of a tip of the ball portion 36 is shared by using a sharing tool 81, and a force is applied in a sharing direction indicated by white arrows to obtain a breaking strength at that time. As a result, it is confirmed whether the bonding strength between the pad 34 and the ball portion 36 is sufficiently secured. Specifically, the bonding strength derived from an alloy Au—Al generated at a bonding interface between Au, which is a metal material of the ball portion 36, and Al—Cu, which is a metal material of the pad 34, is confirmed.

As described above, in order to avoid the risk that the metal wire 32 interferes with the insulating layer 52, the ball portion 36 needs to have a thick shape, and also in order to cope with such an inspection, the ball portion 36 needs to have a thick shape.

Here, the imaging element package 11 is packed in a moisture-proof manner and shipped to a manufacturer of electronic devices. Then, the manufacturer of electronic devices opens the moisture-proof pack, takes out the imaging element package 11, performs reflow, and solder-packages the imaging element package on a printed circuit board of an electronic device. At this time, a resin portion such as the sealing resin 24 and the sealing glass resin 25 constituting the imaging element package 11 and the semiconductor mounting substrate 22 absorb moisture during a period from opening of the moisture-proof pack to reflow. Therefore, in the reflow, the absorbed moisture vaporizes and expands to further increase the stress, and thus there is a further concern that the sealing glass resin 25 for packaging the sealing glass 23 is peeled off and the wire wiring 31 is disconnected. On the other hand, in the imaging element package 11 to which the present technology is applied, the occurrence of such a concern is avoided, and as a result, the reliability can be more securely enhanced.

<Configuration Example of Electronic Device>

The above-described imaging element package 11 is applicable to various electronic devices including, for example, an imaging system such as a digital still camera and a digital video camera, a mobile phone having an imaging function, an in-vehicle camera, and others devices having an imaging function.

Figure 16:
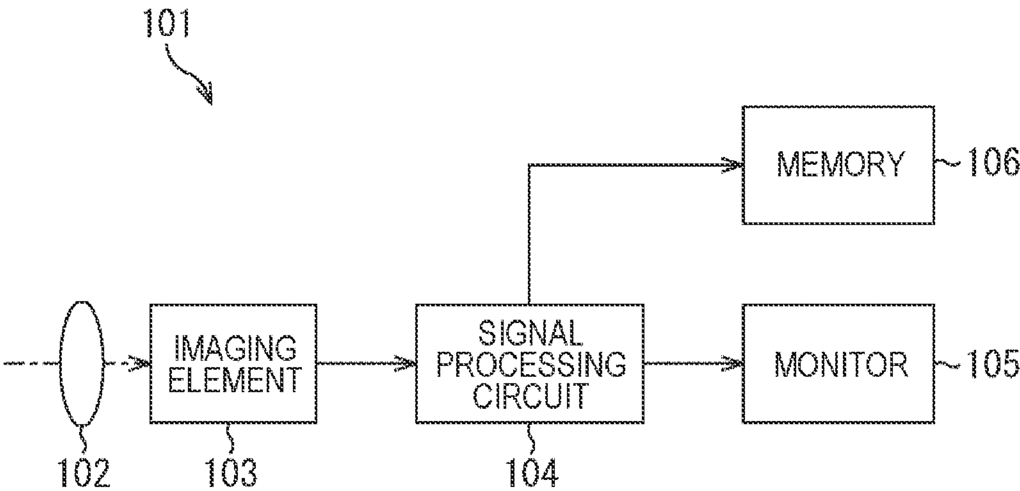
FIG. 16 is a block diagram showing a configuration example of an imaging device.

FIG. 16 is a block diagram showing a configuration example of an imaging device mounted on an electronic device.

As shown in FIG. 16, an imaging device 101 includes an optical system 102, an imaging element 103, a signal processing circuit 104, a monitor 105, and a memory 106, and can capture a still image and a moving image.

The optical system 102 including one or a plurality of lenses guides image light from an object (incident light) to the imaging element 103 to form an image on a light-receiving surface (sensor unit) of the imaging element 103.

As the imaging element 103, the imaging element package 11 described above is applied. Electrons are accumulated in the imaging element 103 for a certain period in accordance with the image formed on the light-receiving surface via the optical system 102. Then, a signal corresponding to the electrons accumulated in the imaging element 103 is supplied to the signal processing circuit 104.

The signal processing circuit 104 performs various types of signal processing on a pixel signal output from the imaging element 103. An image (image data) obtained by the signal processing applied by the signal processing circuit 104 is supplied to the monitor 105 to be displayed or supplied to the memory 106 to be stored (recorded).

The imaging device 101 configured as described above, for example, can further enhance the reliability and securely capture an image by applying the imaging element package 11 described above.

<Use Examples of Image Sensor>

Figure 17:
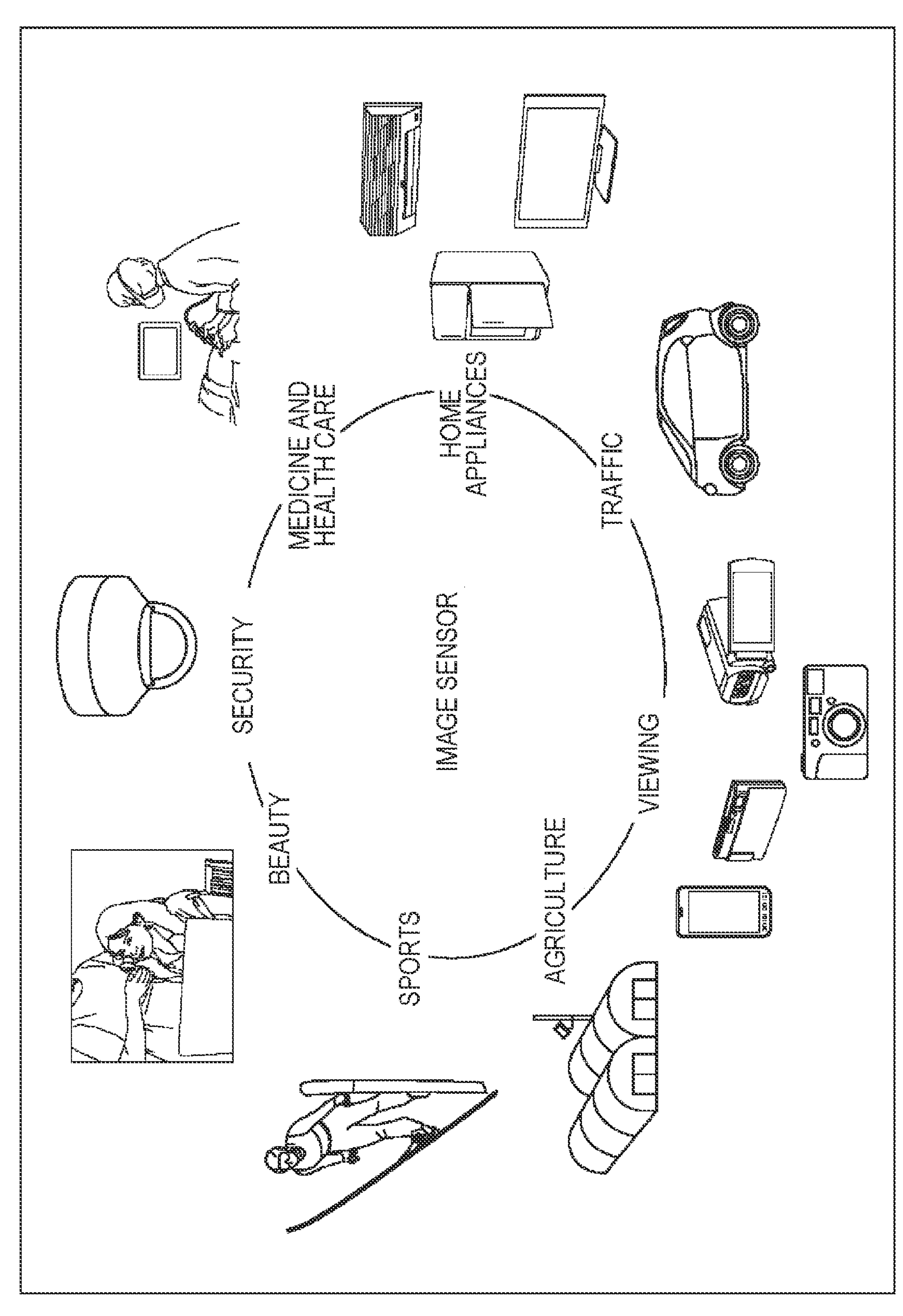
FIG. 17 is a diagram showing usage examples of an image sensor.

FIG. 17 is a diagram showing use examples of the image sensor (imaging element package) described above.

The image sensor described above can be used in various cases for sensing light such as visible light, infrared light, ultraviolet light, and X-ray as described below, for example.

- A device that captures an image to be used for viewing, such as a digital camera and a portable device with a camera function.
- A device used for traffic, such as an in-vehicle sensor that captures images of the front, rear, surroundings, inside, and the like of an automobile for safe driving such as automatic stop and recognition of a driver's condition, a monitoring camera that monitors traveling vehicles and roads, and a ranging sensor that measures a distance between vehicles and the like.
- A device used for home electric appliances such as a TV, a refrigerator, and an air conditioner in order to capture an image of a gesture of a user and perform a device operation according to the gesture.
- A device used for medical care and health care, such as an endoscope, a device that performs angiography by receiving infrared light, and the like.
- A device for security use, such as a security monitoring camera and an individual authentication camera.
- A device used for beauty care, such as a skin condition measuring device for capturing an image of skin, and a microscope for capturing an image of scalp.
- A device for sporting use, such as an action camera and a wearable camera for sporting use and the like
- A device for agricultural purpose, such as a camera for monitoring conditions of fields and crops.

<Example of Combination of Configurations>

Note that the present technology can adopt the following configurations.

(1)

An imaging element package includes a solid-state imaging element having a first pad, a substrate on which the solid-state imaging element is mounted, the substrate having a second pad, and a wire wiring that connects the first pad and the second pad by a metal wire, in which the wire wiring includes a ball portion bonded to the first pad in a shape having a thickness equal to or larger than a depth of an opening provided for opening the first pad in the solid-state imaging element, and a crescent portion provided by pressing an end of the metal wire against the ball portion and bonding the end to the ball portion, the crescent portion being connected to the metal wire with a connection length of a predetermined ratio or more with respect to the metal wire.

(2)

In the imaging element package according to (1) described above, the ball portion and the crescent portion are formed in a shape in which a ratio of the connection length to a diameter of the ball portion is 2/3 or more.

(3)

In the imaging element package according to (1) or (2) described above, in the wire wiring, the ball portion is formed in a shape in which a thickness of the ball portion with respect to a diameter of the ball portion is equal to or larger than a first specified value, the ball portion and the crescent portion are formed in a shape in which a thickness of the crescent portion with respect to the diameter of the ball portion is equal to or smaller than a second specified value, and the ball portion and the crescent portion are formed in a shape in which a width of the crescent portion with respect to the diameter of the ball portion is equal to or larger than a third specified value.

(4)

In the imaging element package according to (3) described above, in a case where the diameter of the ball portion is approximately 66 μm, the first specified value is approximately 14 μm, the second specified value is 10 μm, and the third specified value is 40 μm.

(5)

In the imaging element package according to any of (1) to (4) described above, the solid-state imaging element has a thickness of 400 μm or more, and at least a part of the wire wiring is sealed with a sealing resin.

(6)

In the imaging element package according to any of (1) to (5) described above, the depth of the opening is approximately 8 μm or more.

(7) A method of manufacturing an imaging element package including a solid-state imaging element having a first pad, a substrate on which the solid-state imaging element is mounted, the substrate having a second pad, and a wire wiring that connects the first pad and the second pad by a metal wire includes bonding a ball portion to the first pad in a shape having a thickness equal to or larger than a depth of an opening provided for opening the first pad in the solid-state imaging element, and connecting a crescent portion provided by pressing an end of the metal wire against the ball portion and bonding the end to the ball portion with a connection length of a predetermined ratio or more with respect to the metal wire.

(8)

In an electronic device including an imaging element package, the imaging element package includes a solid-state imaging element having a first pad, a substrate on which the solid-state imaging element is mounted, the substrate having a second pad, and a wire wiring that connects the first pad and the second pad by a metal wire, the wire wiring includes a ball portion bonded to the first pad in a shape having a thickness equal to or larger than a depth of an opening provided for opening the first pad in the solid-state imaging element, and a crescent portion provided by pressing an end of the metal wire against the ball portion and bonding the end to the ball portion, the crescent portion being connected to the metal wire with a connection length of a predetermined ratio or more with respect to the metal wire.

Note that the present embodiment is not limited to the embodiment described above, and various modifications can be made without departing from the gist of the present disclosure. Furthermore, the effects herein described are merely examples and are not limited, and other effects may be obtained.

REFERENCE SIGNS LIST

11 Imaging element package
21 Solid-state imaging element
22 Semiconductor mounting substrate
23 Sealing glass
24 Sealing resin
25 Sealing glass resin
26 Die bond resin
27 Solder ball
31 Wire wiring
32 Metal wire
33 and 34 Pad
35 and 36 Ball portion
37 Crescent portion
41-1 to 41-4 Wiring
42 Prepreg
43 and 44 Insulating film
45 Nickel layer
46 Gold plating layer
47 Nickel layer
48 Gold plating layer
51 Semiconductor substrate
52 Insulating layer
53 Opening

What is claimed is:

1. An imaging element package, comprising:
a solid-state imaging element having a first pad;
a substrate on which the solid-state imaging element is mounted, the substrate having a second pad;
an insulating layer provided on a surface of the solid-state imaging element above the first pad; and
a wire wiring that connects the first pad and the second pad by a metal wire,
wherein the wire wiring includes:
a ball portion bonded to the first pad, the ball portion having a thickness equal to or greater than a depth of an opening exposing the first pad in the solid-state imaging element, and being disposed without overlapping end portions of the insulating layer defining the opening; and
a crescent portion at an end of the metal wire bonded to the ball portion, the crescent portion being connected to the metal wire over a connection length, and
wherein the depth of the opening is approximately 8 μm or more.

2. The imaging element package according to claim 1, wherein the ball portion and the crescent portion are provided such that a ratio of the connection length to a diameter of the ball portion is 2/3 or more.

3. The imaging element package according to claim 1, wherein in the wire wiring, the ball portion is provided in which a thickness of the ball portion with respect to a diameter of the ball portion is equal to or larger than a first specified value, the ball portion and the crescent portion are provided in which a thickness of the crescent portion with respect to the diameter of the ball portion is equal to or less than a second specified value, and the ball portion and the crescent portion are provided in which a width of the crescent portion with respect to the diameter of the ball portion is equal to or larger than a third specified value.

4. The imaging element package according to claim 3, wherein in a case where the diameter of the ball portion is approximately 66 μm, the first specified value is approximately 14 μm, the second specified value is 10 μm, and the third specified value is 40 μm.

5. The imaging element package according to claim 1, wherein
the solid-state imaging element has a thickness of 400 μm or more, and
at least a part of the wire wiring is sealed with a sealing resin.

6. The imaging element package according to claim 1, wherein the substrate includes a plurality of wiring layers.

7. The imaging element package according to claim 1, wherein the second pad includes a nickel layer and a gold plating layer.

8. A method of manufacturing an imaging element package including a solid-state imaging element having a first pad, a substrate on which the solid-state imaging element is mounted, the substrate having a second pad, an insulating layer provided on a surface of the solid-state imaging element above the first pad, and a wire wiring that connects the first pad and the second pad by a metal wire, the method comprising:

bonding a ball portion to the first pad, the ball portion having a thickness equal to or greater than a depth of an opening exposing the first pad in the solid-state imaging element, and being disposed without overlapping end portions of the insulating layer defining the opening; and connecting a crescent portion at an end of the metal wire bonded to the ball portion, the crescent portion being connected to the ball portion over a connection length, wherein the depth of the opening is approximately 8 μm or more.

9. The method of manufacturing an imaging element package according to claim 8, wherein the ball portion and the crescent portion are provided such that a ratio of the connection length to a diameter of the ball portion is 2/3 or more.

10. The method of manufacturing an imaging element package according to claim 8, wherein the solid-state imaging element has a thickness of 400 μm or more, and at least a part of the wire wiring is sealed with a sealing resin.

11. The method of manufacturing an imaging element package according to claim 8, wherein the substrate includes a plurality of wiring layers.

12. The method of manufacturing an imaging element package according to claim 8, wherein the second pad includes a nickel layer and a gold plating layer.

13. The method of manufacturing an imaging element package according to claim 8, wherein in the wire wiring, the ball portion is provided in which a thickness of the ball portion with respect to a diameter of the ball portion is equal to or larger than a first specified value, the ball portion and the crescent portion are provided in which a thickness of the crescent portion with respect to the diameter of the ball portion is equal to or less than a second specified value, and the ball portion and the crescent portion are provided in which a width of the crescent portion with respect to the diameter of the ball portion is equal to or larger than a third specified value.

14. An electronic device, comprising:

an optical system;

an imaging element package that receives light from the optical system, wherein the imaging element package comprises:

a solid-state imaging element having a first pad;

a substrate on which the solid-state imaging element is mounted, the substrate having a second pad;

an insulating layer provided on a surface of the solid-state imaging element above the first pad; and a wire wiring that connects the first pad and the second pad by a metal wire, wherein the wire wiring includes:

a ball portion bonded to the first pad, the ball portion having a thickness equal to or greater than a depth of an opening exposing the first pad in the solid-state imaging element, and being disposed without overlapping end portions of the insulating layer defining the opening; and a crescent portion at an end of the metal wire bonded to the ball portion, the crescent portion being connected to the metal wire over a connection length, and wherein the depth of the opening is approximately 8 μm or more; and a digital signal processor that processes signals received from the imaging element package.

15. The electronic device according to claim 14, wherein the ball portion and the crescent portion are provided such that a ratio of the connection length to a diameter of the ball portion is 2/3 or more.

16. The electronic device according to claim 14, wherein in the wire wiring, the ball portion is provided in which a thickness of the ball portion with respect to a diameter of the ball portion is equal to or larger than a first specified value, the ball portion and the crescent portion are provided in which a thickness of the crescent portion with respect to the diameter of the ball portion is equal to or less than a second specified value, and the ball portion and the crescent portion are provided in which a width of the crescent portion with respect to the diameter of the ball portion is equal to or larger than a third specified value.

17. The electronic device according to claim 16, wherein in a case where the diameter of the ball portion is approximately 66 μm, the first specified value is approximately 14 μm, the second specified value is 10 μm, and the third specified value is 40 μm.

18. The electronic device according to claim 14, wherein the solid-state imaging element has a thickness of 400 μm or more, and at least a part of the wire wiring is sealed with a sealing resin.

19. The electronic device according to claim 14, wherein the substrate includes a plurality of wiring layers.

20. The electronic device according to claim 14, wherein the second pad includes a nickel layer and a gold plating layer.

* * * * *